US006613448B1

(12) United States Patent
Akinaga et al.

(10) Patent No.: US 6,613,448 B1
(45) Date of Patent: Sep. 2, 2003

(54) MAGNETORESISTANCE EFFECT FILM AND METHOD OF FORMING SAME

(75) Inventors: Hiroyuki Akinaga, Ibaraki (JP);
Masaharu Oshima, Tokyo (JP);
Masaki Mizuguchi, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 09/525,318

(22) Filed: Mar. 13, 2000

(30) Foreign Application Priority Data

Mar. 25, 1999 (JP) .......................... 11-082062
Jul. 19, 1999 (JP) .......................... 11-204443

(51) Int. Cl.[7] .................. B32B 15/04; B32B 15/16; G11B 5/127

(52) U.S. Cl. .................. 428/611; 428/693; 428/642; 360/313; 365/158

(58) Field of Search .................. 428/611, 546, 428/557, 558, 614, 615, 636, 637, 692, 693, 697, 900, 642, 655; 360/313, 324, 326; 324/207.21; 252/62.55; 365/158; 117/954

(56) References Cited

U.S. PATENT DOCUMENTS

| | | | | |
|---|---|---|---|---|
| 5,476,680 | A | * 12/1995 | Coffey et al. | 427/130 |
| 5,585,196 | A | * 12/1996 | Inomata et al. | 428/557 |
| 5,594,933 | A | * 1/1997 | Hayashi et al. | 428/546 |
| 5,773,156 | A | * 6/1998 | Inomata et al. | 428/611 |
| 6,016,241 | A | * 1/2000 | Coffey et al. | 360/113 |
| 6,132,524 | A | 10/2000 | Akinaga et al. | |
| 6,232,777 | B1 | * 5/2001 | Sato et al. | 324/252 |
| 6,307,241 | B1 | * 10/2001 | Awschalom et al. | 257/421 |

FOREIGN PATENT DOCUMENTS

| | | |
|---|---|---|
| JP | 8-67966 | 3/1996 |
| JP | 8-133894 | 5/1996 |
| JP | 8-264858 | 10/1996 |
| JP | 9-249497 | 9/1997 |
| JP | 9-263495 | 10/1997 |

OTHER PUBLICATIONS

U.S. patent application Ser. No. 09/525,318, filed Mar. 13, 2000, pending.

U.S. patent application Ser. No. 09/556,405, filed Apr. 24, 2000, pending.

U.S. patent application Ser. No. 09/947,513, filed Sep. 7, 2001, pending.

(List continued on next page.)

Primary Examiner—Michael LaVilla
(74) Attorney, Agent, or Firm—Oblon, Spivak, McClelland, Maier & Neustadt, P.C.

(57) ABSTRACT

A magnetoresistance effect film includes a substrate, a plurality of ferromagnetic particles disposed on the substrate, a nonmagnetic film deposited on the substrate and covering the plurality of ferromagnetic particles, and a pair of electrodes arranged on the nonmagnetic film, in which the resistance across the pair of electrodes is changed by applying a magnetic field. The magnetoresistance effect film is manufactured by vapor-depositing ferromagnetic particle starting material on a substrate at a temperature not exceeding 300° C., the starting material being vapor-deposited in an amount enough to cover the substrate surface to a thickness ranging from 0.5 to 15 nm, and, after formation of ferromagnetic particles on the substrate, vapor-depositing at a temperature not exceeding room temperature a nonmagnetic film over the ferromagnetic particles, the nonmagnetic film having a thickness ranging from 1 to 100 nm, and providing a pair of electrodes each at a predetermined position on the nonmagnetic film.

4 Claims, 8 Drawing Sheets

OTHER PUBLICATIONS

U.S. patent application Ser. No. 09/525,318, filed Mar. 13, 2000, pending.

T. R. McGuire, et al., "Anisotropic Magnetoresistance in Ferromagnetic 3d Alloys," IEEE Transactions on Magnetics, vol. Mag–11, No. 4, (Jul. 1975), pp. 1018–1038.

M. N. Baibich, et al., "Giant Magnetoresistance of (001) Fe/(001) Cr Magnetic Superlattices," Physical Review Letters, vol. 61, No. 21, (Nov. 21, 1988), pp. 2472–2475.

S. S. P. Parkin, et al., "Giant Magnetoresistance in Antiferromagnetic Co/Cu Multilayers," Appl. Phys. Lett., vol. 58, No. 23, (Jun. 10, 1991), pp. 2710–2712.

J. S. Moodera, et al., "Large Magnetoresistance at Room Temperature in Ferromagnetic Thin Film Tunnel Junctions," Physical Review Letters, vol. 74, No. 16, (Apr. 17, 1995), pp. 3273–3276.

N. Tezuka, et al., "Magnetic Tunneling Effect in Ferromagnet/$Al_2O_3$/Ferromagnet Junctions," vol. 19, No. 2, (1995), pp. 369–372. (no month).

John Q. Xiao, et al., "Giant Magnetoresistance in Nonmultilayer Magnetic Systems," Physical Review Letters, vol. 68, No. 25, (Jun. 22, 1992), pp. 3749–3752.

A. E. Berkowitz, et al., "Giant Magnetoresistance in Heterogeneous Cu–Co Alloys," Physical Review Letters, vol. 68, No. 25, (Jun. 22, 1992), pp. 3745–3748.

L. Jirman, et al., "Magnetic and Transport Properties of UNiGa," Journal of Magnetism and Magnetic Materials 104–107, (1992), pp. 19–20. (no month).

K. –I. Kobayashi, et al., "Room–temperature Magnetoresistance in an Oxide Material With an Ordered Double–perovskite Structure," Nature, vol. 395, No. 6703, (Oct. 15, 1998), pp. 677–680.

L. J. van der Pauw, A Method of Measuring The Resistivity And Hall Coefficient On Lamellae Of Arbitrary Shape, Philips Technical Review, vol. 20, No. 8, pp. 220–224. (no date).

M. Behet, et al., "InAs/(Al,Ga)Sb Quantum Well Structures for Magnetic Sensors," IEEE Transactions on Magnetics, vol. 34, No. 4, (Jul. 1998), pp. 1300–1302.

H. Akinaga, et al., "Influence of GaAs (001) Surface Termination on the In–Plane Magnetic Anisotropies of MnSb Epitaxial Films," Applied Physics Letters, vol. 73, No. 22, (Nov. 30, 1998), pp. 3285–3287.

* cited by examiner

VOLTAGE SWEEP DIRECTION →

MAGNETORESISTANCE EFFECT FILM AND METHOD OF FORMING SAME

BACKGROUND OF THE INVENTION

1. Field of the Invention

The present invention relates to a magnetoresistance effect film that uses the magnetoresistance effect to record and read information or to detect weak magnetic fields and to a method of forming the magnetoresistance effect film.

2. Description of the Prior Art

In recent years the magnetoresistance effect is being used to increase the sensitivity of magnetic sensors and to develop high performance magnetic heads for magnetic recording. These magnetic sensors and magnetic heads both read changes in resistance of the portion comprised of magnetic material produced by the application of the magnetic field to that portion, so research is focused on obtaining materials that exhibit a large change in magnetoresistance in response to a change in an external magnetic field.

Film of permalloy etc. exhibiting an anisotropic magnetoresistance effect has been used as a magnetoresistance effect material. However, the ratio of change in magnetoresistance exhibited by a material such as permalloy is only around two or three percent [IEEE Transactions on Magnetics, Vol. MAG-11, No. 4, p. 1018 (1975)], meaning it does not provide the type of performance that will be required by the high level information society of the future. Here, the change in magnetoresistance is defined as the amount of change in resistance produced by the application of a magnetic field that is the differential between the maximum resistance Rmax and the minimum resistance Rmin, and as shown by $$\Delta R/R = 100(\%) \times (R\text{max} - R\text{min})/R\text{min},$$

the ratio of change in magnetoresistance is defined as a ratio between the amount of change and Rmin.

There is a new magnetoresistance effect material comprising a laminated artificial lattice film formed by alternating magnetic and nonmagnetic layers. This film exhibits a giant magnetoresistance effect that is dependent on the magnetic orientation of the magnetic layers coupled in an antiparallel magnetic fashion by the nonmagnetic layers. An artificial lattice film of Fe/Cr is a recent example of such research [Physical Review Letters, Vol. 61, No. 21, p. 2472 (1988)]. This type of artificial lattice film exhibits a magnetoresistance effect that is much larger than that exhibited by a conventional material such as permalloy, and in the case of an artificial lattice film of Co/Cu, a 65% magnetoresistance effect has been observed at room temperature [Applied Physics Letters, Vol. 58, No. 23, p. 2710 (1991)].

Further research has led to the proposal of the so-called spin-valve film having a sandwich structure of ferromagnetic metal layer/nonmagnetic insulating layer/ferromagnetic metal layer. This spin-valve film reads the change in magnetoresistance arising when the direction of the magnetization of one ferromagnetic layer against that of the other ferromagnetic layer changes by the applied magnetic field. As a result of recent intensive studies, a magnetoresistance effect at room temperature of as large as 10 to 20% has been reported [Physical Review Letters, Vol. 74, No. 16, p. 3273 (1995), and Journal of the magnetic society of Japan, Vol. 19, No. 2, p. 369 (1995)].

With respect to obtaining a large magnetoresistance effect with a small magnetic field, intensive studies are being conducted into granular magnetic films, which are films comprised of ferromagnetic particles dispersed in a nonmagnetic metal, semiconductor or insulator film matrix. While in the absence of a magnetic field such granular films exhibit high resistance, with there being no order to the direction of the magnetization of the magnetic particles, the application of a magnetic field produces a uniform alignment of magnetization that reduces the resistance, giving rise to the magnetoresistance effect. When the films were first developed, this effect was only obtained at low temperatures [Physical Review Letters, Vol. 68, No. 25, pp. 3745 and 3749 (1992)]. In subsequent studies, however, a magnetoresistance effect of several percent has been achieved at room temperature [Japanese Unexamined Patent Publication No. Hei 8-264858], and a magnetoresistance effect of 18% with a combination of ferromagnetic metal and nonmagnetic metal [Japanese Unexamined Patent Publication No. Hei 8-67966].

As an example of a new material that exhibits an even larger magnetoresistance effect, there is a report of a magnetoresistance effect of around 500% being achieved, at a low temperature, with UNiGa [Journal of Magnetism and Magnetic Materials, Vol. 104–107, p. 19 (1992)]. However, the effect was only observed at low temperatures.

Another recent research trend that can be mentioned relates to the giant magnetoresistance effect exhibited by perovskite oxides (Japanese Unexamined Patent Publication Nos. Hei 8-133894, 9-249497 and 9-263495, and U.S. Pat. No. 5,665,664). However, while such perovskite oxides exhibit several magnitudes of change in magnetoresistance at low temperatures, at room temperature the performance drops off dramatically, to a matter of several percent [Nature, Vol. 395, No. 6703, p. 677 (1998)], posing problems in terms of practical application.

The spread of medical, educational and commercial connection services using advanced communication systems and/or the Internet is creating a need for even larger-capacity storage technologies. To answer this need, it is necessary to develop magnetoresistance effect devices having an extremely high level of sensitivity.

The object of this invention is to provide a film that exhibits a colossal magnetoresistance effect of 73000% at room temperature (20° C.) and 4000000% at −20° C. and a method of forming the film.

SUMMARY OF THE INVENTION

To achieve the above object, the present invention provides a magnetoresistance effect film comprising a substrate, a plurality of ferromagnetic particles disposed on the substrate, a nonmagnetic film deposited on the substrate and covering the plurality of ferromagnetic particles, and a pair of electrodes provided each at a predetermined position on the nonmagnetic film, in which resistance across the pair of electrodes is changed by application of a magnetic field and provides a method of manufacturing a magnetoresistance effect film, comprising the steps of vapor-depositing ferromagnetic particle starting material on a substrate at a temperature not exceeding 300° C., the starting material being vapor-deposited in an amount enough to cover a substrate surface to a thickness ranging from 0.5 to 15 nm, and, after formation of ferromagnetic particles on the substrate, vapor-depositing at a temperature not exceeding room temperature a nonmagnetic film over the ferromagnetic particles, the nonmagnetic film having a thickness ranging from 1 to 100 nm, and providing a pair of electrodes each at a predetermined position on the nonmagnetic film.

When an electric current or voltage is supplied to the film in the applied magnetic field, the change caused by electrons flowing in the nonmagnetic layer being scattered by the plurality of ferromagnetic particles gives rise to a giant magnetoresistance effect. This giant magnetoresistance effect is read by the pair of electrodes maintained a predetermined distance apart on the non-magnetic film, setting up a current flow across the electrodes via the nonmagnetic film, the interface between the ferromagnetic particles and the substrate and the interface between the nonmagnetic film and the substrate that undergoes a major resistance change as a result of the giant magnetoresistance effect produced by the mutual magnetic interaction between the ferromagnetic particles covered by the nonmagnetic film and the electrons flowing across the electrodes.

When the ferromagnetic particles and nonmagnetic film are constituted by a MnSb-Sb combination, the result is a giant magnetoresistance effect of some 300000% at 0° C., and 4000000% at −20° C.

Further features of the invention, its nature and various advantages will become apparent from the accompanying drawings and following detailed description of the invention.

DESCRIPTION OF THE PREFERRED EMBODIMENT

Figures 1A, 1B:
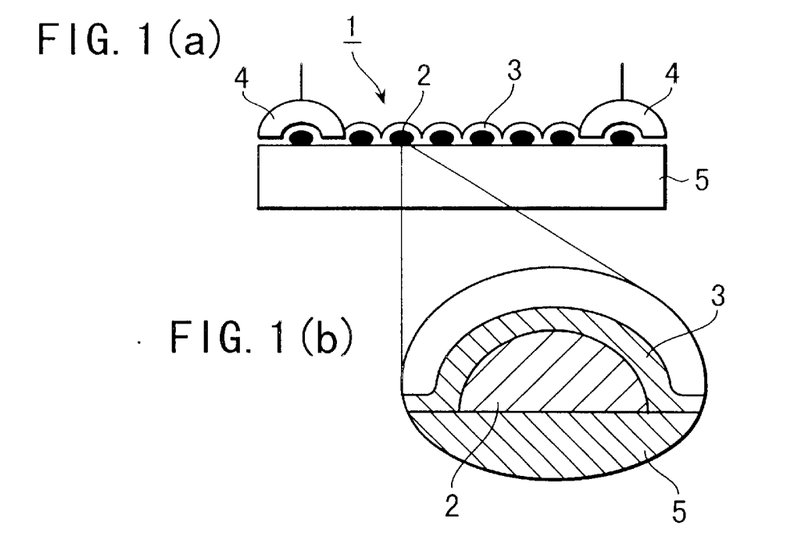
FIG. 1(a) is a cross-sectional view of a magnetoresistance effect film according to an embodiment of the invention.
FIG. 1(b) is an enlarged cross-sectional view of the film of FIG. 1(a).

A magnetoresistance effect film according to the invention will now be described with reference to FIG. 1. FIG. 1(a) is a cross-sectional view of a magnetoresistance effect film 1 that is an embodiment of the invention, and FIG. 1(b) is an enlarged view of part of the film of FIG. 1(a). Reference numeral 2 denotes a plurality of ferromagnetic particles disposed on a substrate 5. The ferromagnetic particles 2 are covered by a nonmagnetic layer 3. A pair of electrodes 4 are provided each at a predetermined position on the nonmagnetic layer 3. While a magnetic field is being applied to the nonmagnetic layer, a constant voltage or a constant current is applied across the electrodes and changes in the resistance between the electrodes are measured.

In this magnetoresistance effect film 1 of the invention the ferromagnetic particles 2 used have a diameter ranging from 3 to 100 nm, and the thickness of the nonmagnetic layer 3 ranges from 1 to 100 nm. If the diameter of the ferromagnetic particles 2 is smaller than 3 nm there will be a complete loss of the ferromagnetic effect, while if the diameter is more than 100 nm, the anisotropic magnetoresistance effect will predominate. Therefore, a diametric range of from 3 to 100 nm is specified. Similarly, the thickness of the nonmagnetic layer 3 is specified as from 1 to 100 nm since the performance of the nonmagnetic layer becomes degraded if the thickness is less than 1 nm. On the other hand, if the thickness exceeds 100 nm, the magnetoresistance effect becomes so relatively small as to be impractical. Moreover, when judged with respect to where large-capacity storage technology is heading, a film of this size has the advantage of being small enough for such future applications and also being practicable enough for immediate application.

A specific example of a method of providing the ferromagnetic particles on the substrate will now be described. Ferromagnetic particles of a material such as, for example, MnSb, were deposited on the substrate by molecular-beam epitaxy (MBE), at a deposition temperature not exceeding 300° C., and more preferably at a temperature within the range of 50 to 250° C. The amount of MnSb deposited was adjusted so that when the substrate surface was completely covered with the MnSb, the thickness of the MnSb layer was 0.5 to 15 nm. When MnSb is thus deposited, it does not form a film, but instead is deposited across the substrate surface as minute plano-convex-shaped dots. The deposition conditions are controlled to achieve a rate of deposition that is preferably within the range of 0.01 to 0.1 sec., to thereby fabricate on the substrate ferromagnetic particles having a diameter ranging from 3 to 100 nm and a predetermined spacing. To obtain an effective magnetoresistance effect, it is preferable that the product of the ferromagnetic particle density and the planar area of the ferromagnetic particles does not exceed the unit area of the substrate. The formation of the ferromagnetic particles on the substrate is followed by the deposition formation of a nonmagnetic layer of the predetermined thickness on the ferromagnetic particles. To obtain a flat film, it is preferable to effect the formation at a temperature ranging from 50° C. to −30° C.

As the combination of the ferromagnetic particles and nonmagnetic film used in this invention, MnSb is used for the ferromagnetic particles and Sb for the nonmagnetic film. While any metal may be used for the electrodes, In, Au, Cu, Ag, and Al are particularly suitable.

In accordance with this invention, the magnetoresistance effect is manifested by the application of a magnetic field producing changes in the scattering by the ferromagnetic particles of electrons flowing in the nonmagnetic layer and across the interfaces between the ferromagnetic particles and the substrate and between the nonmagnetic layer and the substrate. Moreover, since it is the nanometric order formation of the ferromagnetic particles and the nonmagnetic layer that gives rise to the large magnitude of the effect, the combination of materials is not limited to MnSb-Sb. Instead, the ferromagnetic particles may be formed of MnSb, MnAs, chromium oxide or other such compound ferromagnetic material, or of a ferromagnetic metal element such as Fe, Co and Ni. The nonmagnetic film may be formed of a metal having good conductivity such as Au, Cu, Ag and Al, a low-conductivity metal such as As or Bi, a group VI semiconductor such as Si or Ge, a group III-V semiconductor such as GaAs, AlAs, InAs, InSb, GaN and AlN, or a group II-VI semiconductor such as ZnO, ZnSe, CdTe and CdS, or it may be formed as an insulation film constituted of an oxide such as antimony oxide, manganese oxide or aluminum oxide, which would therefore increase the magnetoresistance effect.

In order to control the magnetic transition temperature, saturation magnetic field and other such magnetic qualities of the magnetic particles according to the invention, the ferromagnetic particles may be formed of a mixture of a plurality of the above substances, or with the addition of at least one element selected from the group consisting of Al, Si, Ti, V, Cr, Cu, Zn, Zr, Nb, Mo, Tc, Ru, Rh, Pd, Ag, Cd, In, Sn, Te, Hf, Ta, W, Re, Os, Ir, Pt, Au, Hg, Tl, Pb and Bi.

Moreover, to control the sensitivity with respect to the applied magnetic field, the nonmagnetic film may be formed of a mixture of a plurality of the above substances, or with the addition of at least one element selected from the group consisting of Ti, V, Cr, Cu, Zn, Zr, Nb, Mo, Tc, Ru, Rh, Pd, Cd, In, Sn, Te, Hf, Ta, W, Re, Os, Ir, Pt, Hg, Tl and Pb. With the MnSb-Sb combination, for example, the maximum magnetic field sensitivity within the 0.05 tesla region (that is, 500 oersted) in which there was a reversible change in resistance relative to the magnetic field was in the order of 200% per tesla, but it was found that this could be increased to around 800% per tesla by forming the nonmagnetic film of GaAs semiconductor instead of Sb.

For the substrate, there may be used a semiconductor such as Si or GaAs, glass, plastic, or an oxide such as MgO. Glass and plastic are cheap, making them suitable for use as substrates for ordinary memory and sensor applications. The fact that glass and plastic can also be fabricated on a semiconductor substrate means they also have good compatibility with existing semiconductor-based electronics. If GaAs is used as the substrate, in-plane anisotropy of even a giant magnetoresistance effect can be exhibited by using selective orientation of unpaired electrons in the [110] or [110] direction to provide in-plane anisotropy. This in-plane anisotropy of the substrate surface can be readily produced using the existing semiconductor technology [H. Akinaga et al., Applied Physics Letters, Vol. 73, No. 22, pp. 3285–3287 (1998)].

Fabrication of the inventive magnetoresistance effect film thus comprised is not limited to the MBE method, but can also be accomplished using other known film fabrication processes such as electron-beam vapor deposition, sputtering, and electrodeposition. The ferromagnetic particles may be formed using the surface energy differential between substrate and ferromagnetic material, phase separation of the substances, modification of the silane compounds of the substrate surface, lithography or other such processes. After the ferromagnetic particles have been formed on the substrate, the nonmagnetic film is formed.

The structure of the ferromagnetic particles and nonmagnetic film thus formed may be evaluated by using a scanning electron microscope, transmission electron microscope, scanning probe microscope or the like. Also, the surface of the magnetoresistance effect film may be provided with an antioxidant layer such as a layer of silicon nitride or silicon oxide. Alternatively, the conductivity and, by extension, the magnetoresistance effect of the nonmagnetic film may be controlled by using oxidization of the nonmagnetic film itself.

To read out the magnetoresistance effect, electrodes of a metal such as In, Au or Ag are provided on the nonmagnetic film. A flow of current takes place between the electrodes, via the nonmagnetic film, whereby the magnetic interaction between the ferromagnetic particles covered by the nonmagnetic film and the electrons flowing across the electrodes generates a very large magnetoresistance effect that produces a major change in the resistance.

The electrodes can be arranged as two voltage electrodes between two opposed current electrodes, forming a four-probe method or four-terminal method in which the degree of voltage change that takes place between the voltage electrodes when a current is applied across the current electrodes is measured, or a two-terminal method may be used in which the electrodes are used for applying both voltage and current, or the van der Pauw method may be used in which four electrodes are disposed in an arbitrary arrangement [Phillips Technical Review, Vol. 20, No. 8, p. 220 (1958/59)]. For application to actual devices, other electrode structures that can be used to enable precise and efficient read-out of the magnetoresistance effect include multielement structures and the Corbino structure [IEEE Transactions on Magnetics, Vol. 34, No. 4, p. 1300 (1998)]. It is desirable to locate the electrodes in a way that does enable the magnetoresistance effect to be read with high precision and high efficiency. Moreover, when there is anisotropy in a magnetoresistance effect film, disposing the electrodes in accordance with the anisotropy enables the differences in the mutual positioning of substance and magnetic field to be used to read the magnetoresistance effect.

As described in the foregoing, in the magnetoresistance effect film of this invention the resistance produced by the flow of current through the nonmagnetic film between the electrodes changes upon the application of a magnetic field by the mutual interaction between the ferromagnetic particles and the electrons. As such, by using ferromagnetic particles of an appropriate size and spacing, the changes in the electron scattering probability resulting from the interaction between the ferromagnetic particles and the electrons will make up a larger proportion of the total resistance that includes that of the nonmagnetic film, enabling a giant magnetoresistance effect to be obtained.

Fabrication examples of the magnetoresistance effect film of the invention will now be described. However, it is to be understood that the invention is not limited to the examples thus described.

EXAMPLE 1

Cleaning of the Substrate Surface

A GaAs (001) semiconductor substrate was used. The substrate surface was etched and the surface energy adjusted by immersing the substrate in an ammonium sulfide solution for one hour. While there are no particular limitations on the immersion time, the time must be long enough to ensure that the GaAs substrate surface is completely terminated by the sulfur. After using ultrapure water to wash off excess sulfur, the substrate was placed in a vacuum chamber and heated to around 400° C. at a vacuum pressure in the order of $10^{-8}$ torr, further expelling surplus sulfur from the GaAs surface and thus fabricating a GaAs surface terminated with several layers of sulfur. The vacuum pressure was then increased to $10^{-9}$ torr and the substrate again heated, to around 500° C., to clean the surface.

MnSb Magnetic Film Vapor Deposition/particle Growth:

The vapor deposition of MnSb was then used to form the ferromagnetic particles on the substrate. In this example, the MnSb vapor deposition was done by molecular-beam epitaxy. The vapor deposition amount of MnSb was adjusted to obtain a layer of MnSb covering the whole surface of the substrate to a thickness of 0.7 nm. Disk-shaped ferromagnetic particles some 2 nm high and averaging 20 nm in diameter were grown at 100° C. on the substrate at a density of around $9 \times 10^{10}$ per unit square centimeter.

Vapor Deposition of Sb Nonmagnetic Film:

Following this, the substrate temperature was reduced to room temperature without degrading the vacuum, and a 10-nm-thick nonmagnetic film of Sb formed by vapor deposition. The magnetoresistance effect film thus obtained comprises the disk-shaped ferromagnetic particles some 2 nm high and averaging 20 nm in diameter and the 10-nm-thick nonmagnetic film of Sb formed at room temperature and covering the disk-shaped ferromagnetic particles.

Formation of Electrodes

In this example In electrodes were soldered on, using a soldering temperature of about 200° C. A van der Pauw electrode configuration was used.

Measurement of Magnetoresistance Effect

Figure 2:
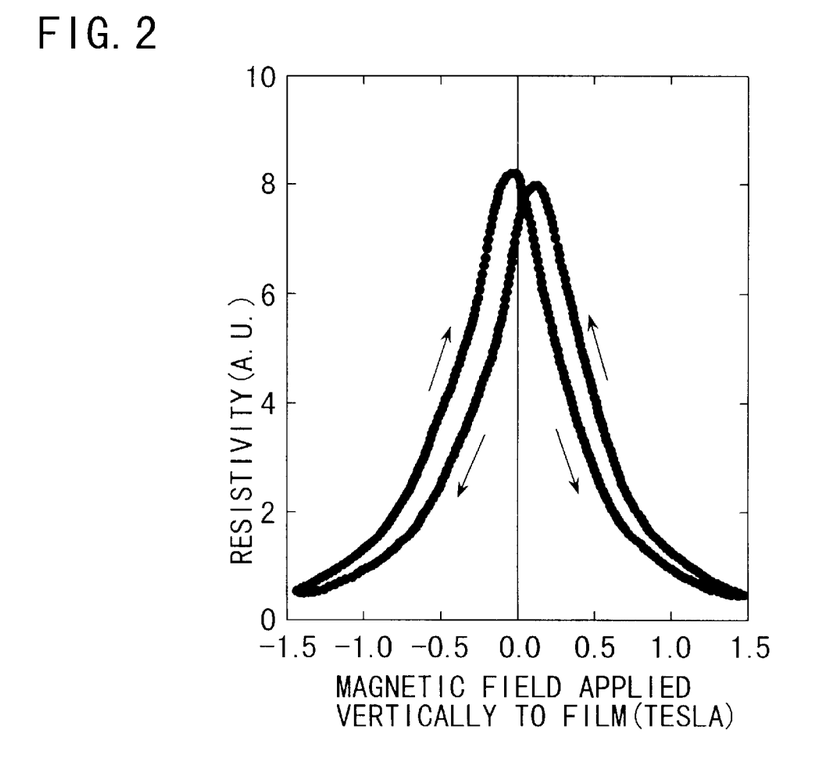
FIG. 2 is a graph showing the curve of the magnetoresistance effect obtained when a magnetic field is applied perpendicularly to a magnetoresistance effect film according to Example 1 of the invention.
Figure 3:
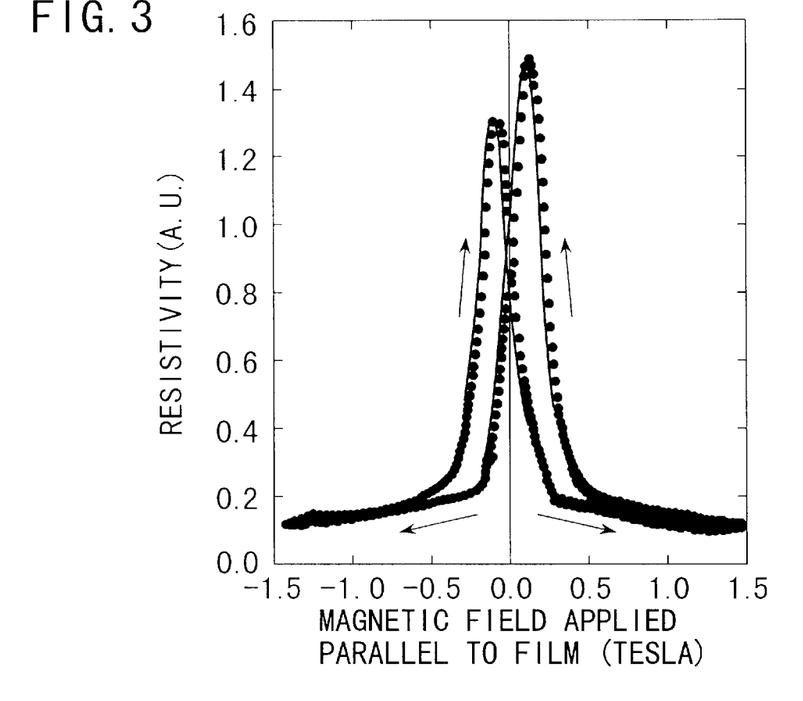
FIG. 3 is a graph showing the curve of the magnetoresistance effect obtained when a magnetic field is applied parallel to the magnetoresistance effect film according to Example 1 of the invention.

The magnetoresistance effect obtained at room temperature when a magnetic field was applied perpendicular and parallel to the plane of the film was measured. The results are shown in FIGS. 2 and 3. In the figures the arrows indicate the sweep direction of the magnetic field. For the measurements, a sweep of 0.07 tesla per second was used.

As can be seen from the magnetoresistance effect curve of FIG. 2, at around the 1.5 tesla point the magnetoresistance effect exhibited by the film when a magnetic field was applied perpendicularly to the film plane was around 1600% of what the effect was when no magnetic field was applied. Moreover, as can be seen from the magnetoresistance effect curve of FIG. 3, when a magnetic field was applied parallel to the plane of the film, at 0.5 tesla the film exhibited a magnetoresistance effect of around 550%, meaning it exhibited increased sensitivity with respect to the magnetic field, and at around 1.5 tesla exhibited a magnetoresistance effect of around 1400%.

Figure 4:
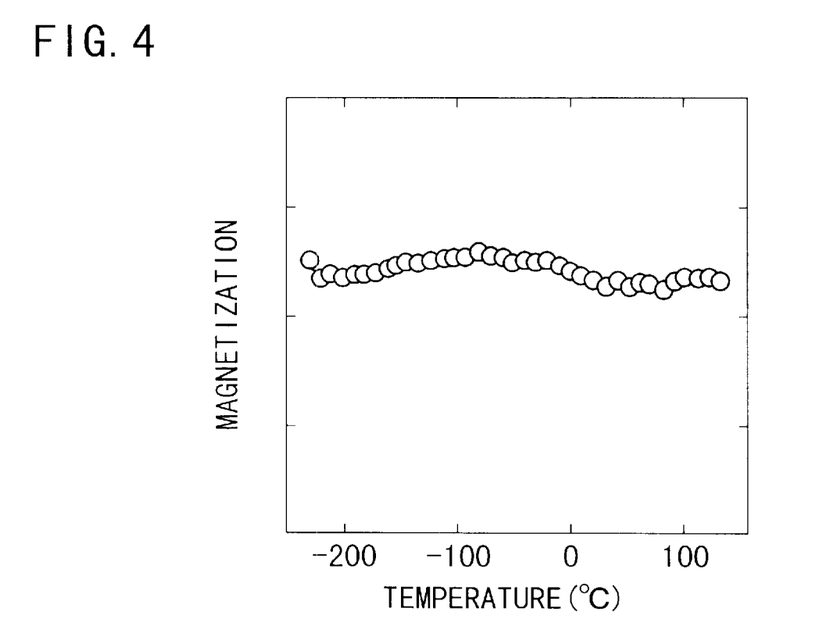
FIG. 4 is a plot of the temperature dependency of the magnetization in the magnetoresistance effect film according to Example 1 of the invention.

While the curves of FIGS. 2 and 3 were obtained using room-temperature measurements, the magnetic characteristics of the film were also measured at temperatures ranging from −230° C. to 130° C. The results of those measurements are shown in FIG. 4. These results show that at least in the above temperature range, a large magnetoresistance effect was manifested on a par with that manifested at room temperature. These characteristics indicate that if the film were to be actually applied to magnetic sensors or magnetic heads, it would enable the fabrication of devices exhibiting stable operation relative to temperature, meaning the characteristics have a very high practical value.

EXAMPLE 2

Figures 5A, 5B, 5C:
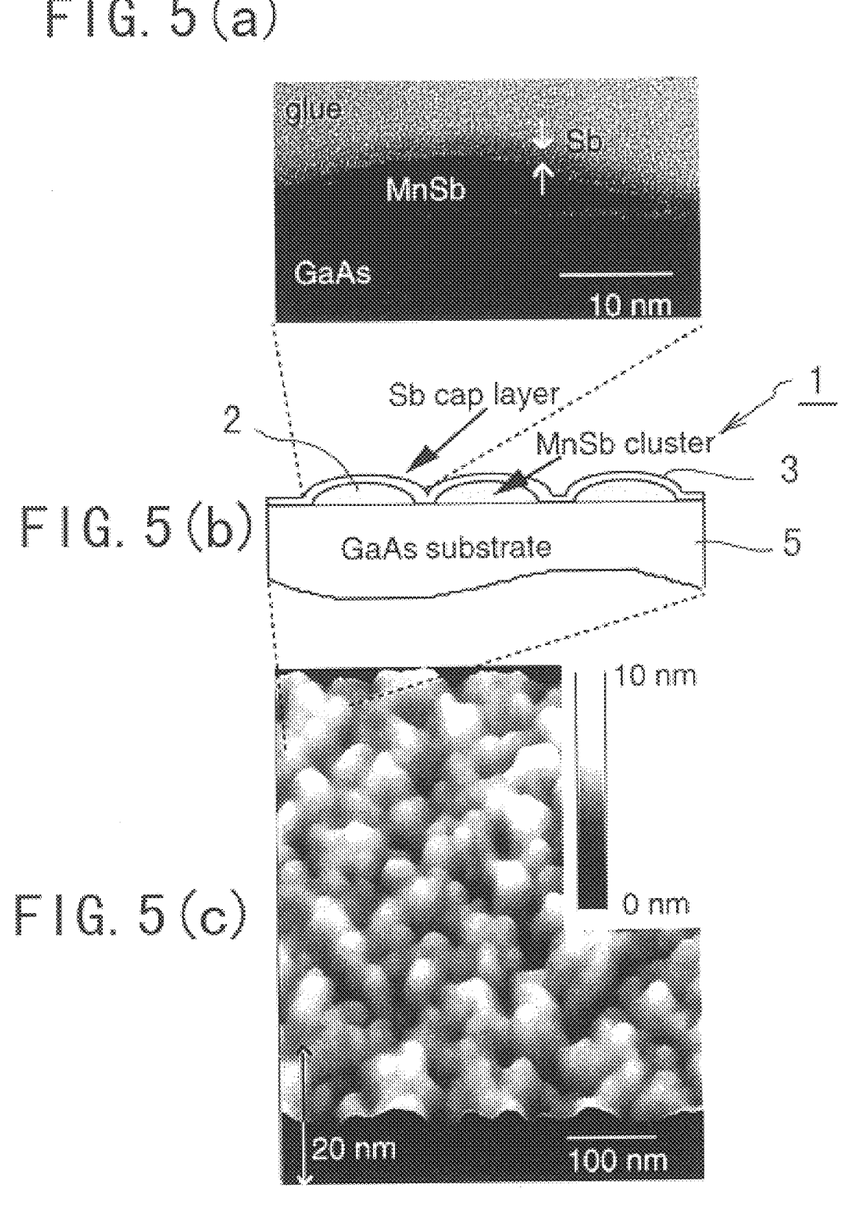
FIG. 5(a) is a transmission electron microscopy image of the film of FIG. 5(c).
FIG. 5(b) is an illustrative cross-sectional view of the films of FIG. 5(a) and FIG. 5(c).
FIG. 5(c) is an atomic force microscopy image of a magnetoresistance effect film according to Example 2 of the invention.

As in Example 1, a GaAs substrate was used on which vapor deposition was used to form MnSb to a thickness of 0.2 nm to form the ferromagnetic particles on the substrate, which were then covered by a 3-nm-thick nonmagnetic film of Sb. The MnSb particles thus obtained in the film were around 20 nm in diameter and 3 to 5 nm high, and were formed at a density of around $9 \times 10^{10}$ per unit square centimeter. FIG. 5(c) is an atomic force microscopy image of the film, and FIG. 5(a) is a transmission electron microscopy image of the film. To make it easier to understand the photographs, FIG. 5(b) shows the film in cross-section. The samples were cut into rectangles to which In electrodes were attached, a constant voltage applied using a two-terminal arrangement, and changes in current and resistance were measured in air at room temperature. The magnetic field application velocity was 0.003 tesla/sec.

Figure 6:
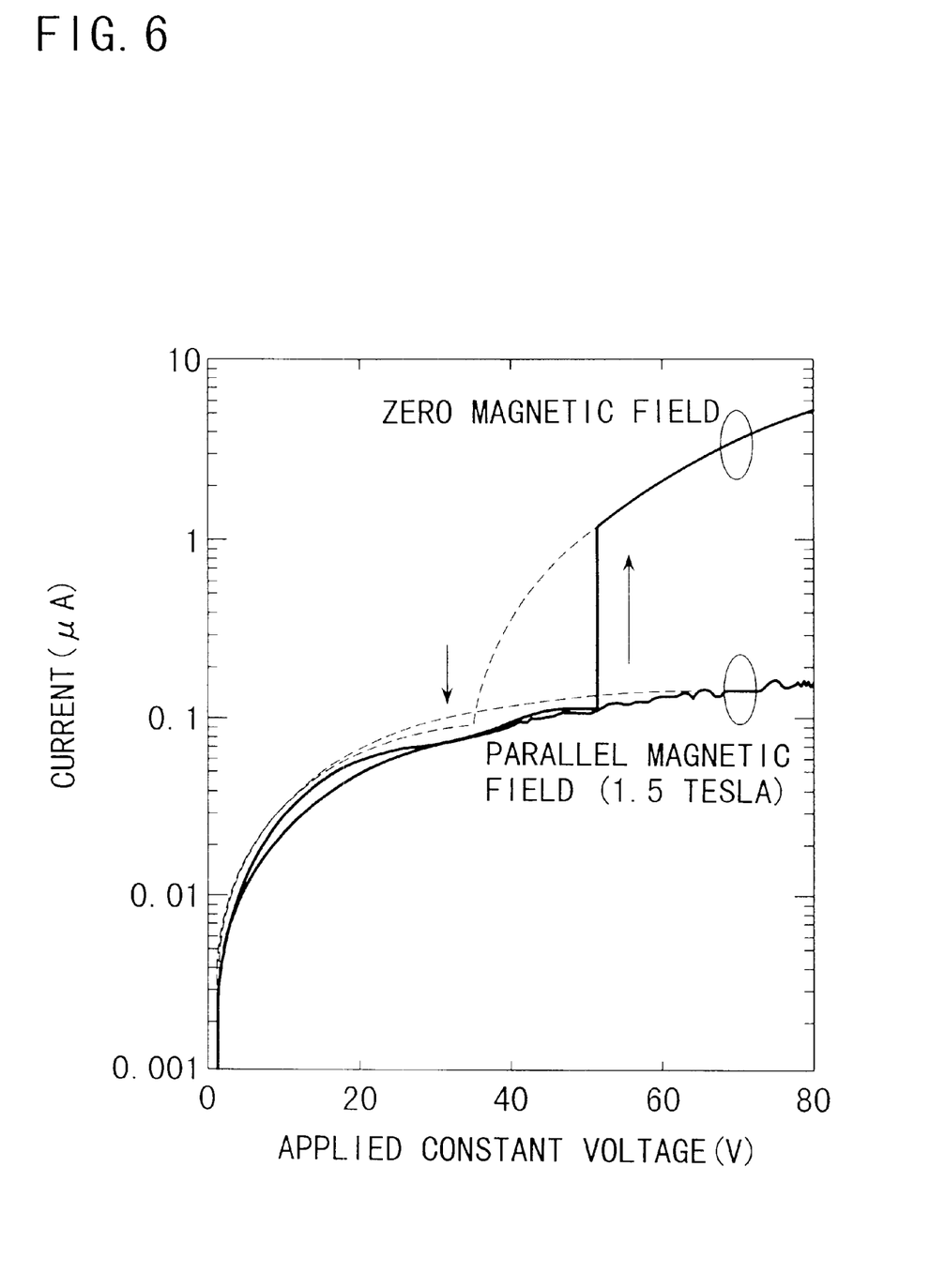
FIG. 6 is a graph showing the magnetic field dependency of the current/voltage characteristics of the magnetoresistance effect film according to Example 2 of the invention.
Figure 7:
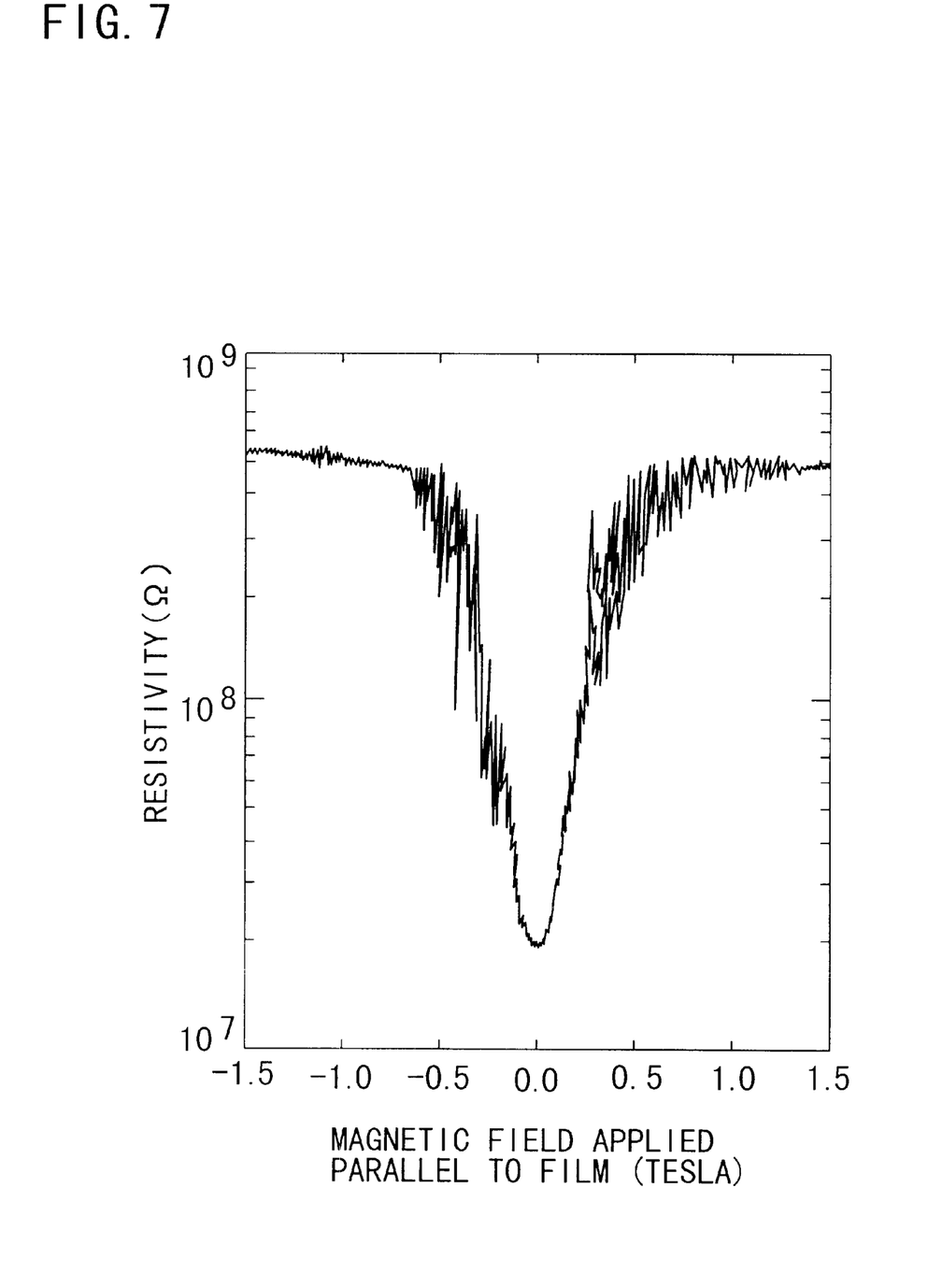
FIG. 7 is a graph showing the magnetic field dependency of the electrical resistance of the magnetoresistance effect film according to Example 2 of the invention when a constant voltage of 68 volts was applied to the film.

Above the constant voltage threshold, a huge magnetoresistance effect was observed. FIG. 6 shows the magnetic field dependence of the current/voltage characteristics measured in air at room temperature. At a voltage of 80 V, the current variation depends on the presence or absence of a magnetic field, and the corresponding ratio of change in the magnetoresistance reached as much as 3500%. The increase in the ratio of change resulting from a further application of voltage can be judged from the slope of the curves. In the figure, the arrows denote the order of the voltage sweep. FIG. 7 shows how the resistance is changed by a magnetic field when a voltage of 68 V was applied. It can be seen that the change in resistance is ended by a relatively small field of around 0.5 tesla. A field of 0.5 tesla can be generated even by a permanent magnet.

Figure 8:
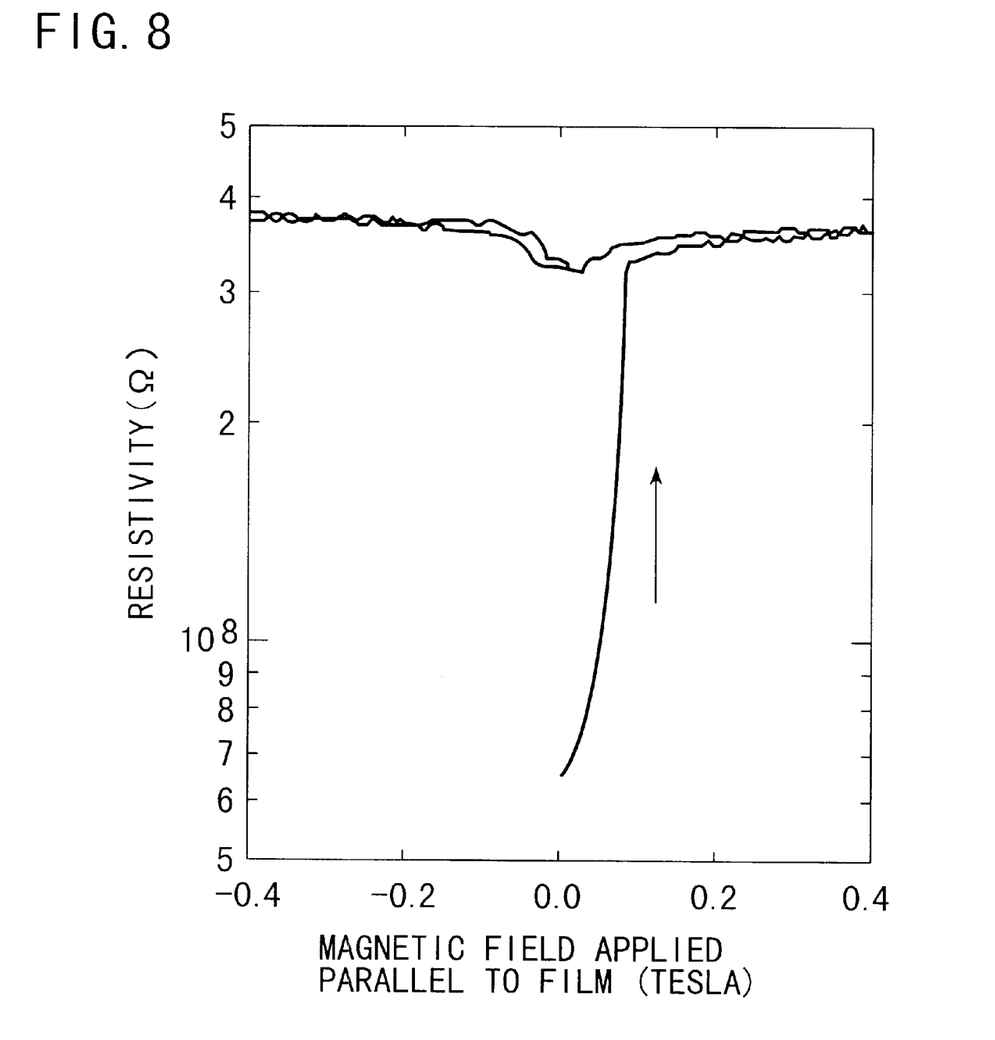
FIG. 8 is a graph showing the magnetic field dependency of the electrical resistance of the magnetoresistance effect film according to Example 2 of the invention when a constant voltage of 44 volts was applied to the film.

The magnetic field strength can be further reduced by setting the voltage in the hysteresis region of the current/voltage curve of FIG. 6. This is shown in FIG. 8. It can be seen that at 0.08 tesla, the change in the resistance relative to the magnetic field substantially ends. Of further importance is the fact that this magnetoresistance effect is nonreversible. The fact that the magnetoresistance effect driven by such a low magnetic field has nonreversibility means the material itself can be used for memory applications.

Figure 9A:
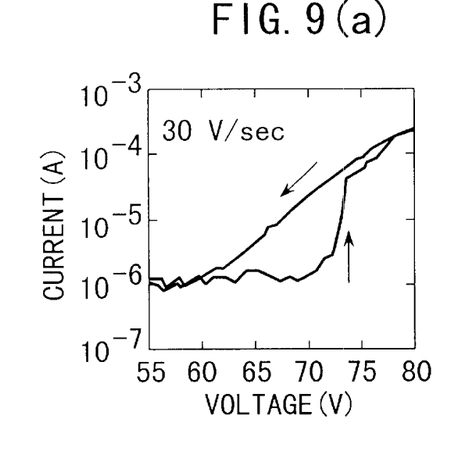
FIG. 9(a) is a graph showing the current/voltage characteristics of the film of FIG. 5 at a sweep velocity of 30 V/sec.
Figure 9B:
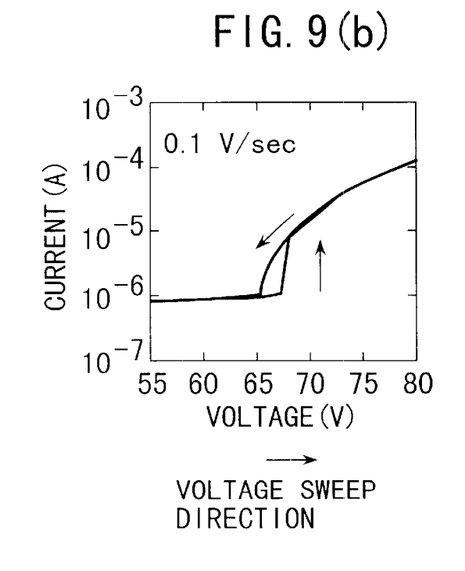
FIG. 9(b) is a graph showing the current/voltage characteristics of the film when the sweep velocity is changed to 0.1 V/sec.

FIG. 9(a) shows the current/voltage characteristics of the above film at a sweep velocity of 30 V/sec., while FIG. 9(b) shows the current/voltage characteristics of the film at a sweep velocity of 0.1 V/sec. What these graphs show is that when the sweep is in a direction in which the voltage is decreased from a voltage above the threshold, the characteristics exhibit no relationship with the voltage sweep velocity. It was confirmed that this state remained stable for over one hour. When the voltage is raised, the characteristics become sensitive to the voltage sweep velocity. Thus, increasing the sweep velocity is substantially equivalent to raising the magnetoresistance effect drive voltage.

Moreover, as a comparison between Example 1 and Example 2 shown, the arrangement of the electrodes can be used to control whether the application of the magnetic field causes the voltage to change positively or negatively. Also, when a constant voltage of 100 V is applied to a film that has been cooled to 0° C., the ratio of change of the magnetoresistance increases to 300000%, and to 4000000% at −20° C., a temperature readily achievable with a simple freezer.

The ratio of magnetoresistance change of the magnetoresistance effect film of the invention was compared to that of a conventional magnetoresistance effect materials. Table 1 below shows the results of the comparison.

TABLE 1

| Magnetoresistance effect material | Typical ratio of magnetoresistance change |
| --- | --- |
| Inventive film | Up to 73000% (room temp.) |
| Inventive film | 300000% (0° C.) |
| Inventive film | 4000000% (−20° C.) |
| Permalloy | <10% |
| Metal multilayer film | Up to 65% |
| Spin-valve film | Up to 20% |
| Granular magnetic film | Up to 20% |
| Perovskite materials | <10% |

Figure 10A:
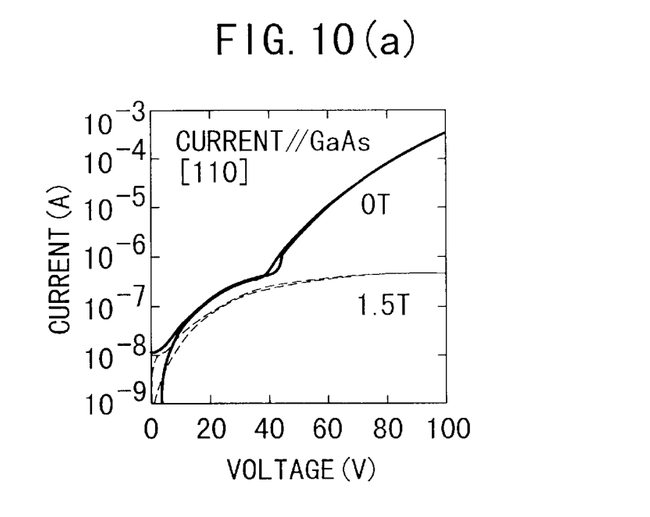
FIG. 10(a) is a graph showing the magnetic field dependency of the current/voltage characteristics in a magnetoresistance effect film according to Example 3 of the invention, in which the current flow is in the [110] direction.

As in Example 2, a film was formed using a GaAs substrate having a (001) crystal orientation and in-plane anisotropy, MnSb ferromagnetic particles and an Sb non-magnetic film. The film thus formed was provided with In electrodes and the magnetic field dependency of the current/voltage characteristics in the [110] and [110] directions of the GaAs substrate measured. FIG. 10(a) is the result obtained when the current flow was in the [110] direction; a major change in the current was observed at the constant voltage, when a magnetic field was applied. At a voltage of 100 V, for example, the ratio of magnetoresistance change exhibited was as much as 73000%.

Figure 10B:
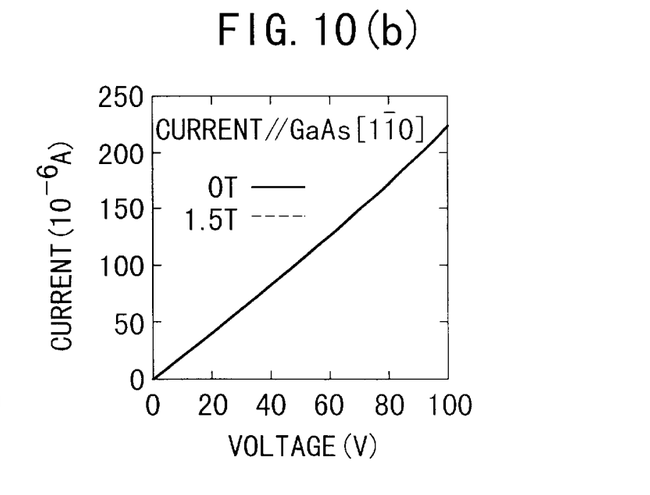
FIG. 10(b) is a graph showing the magnetic field dependency of the current/voltage characteristics in the film of FIG. 10(a) when the current is flowing in the [110] direction.

When the current flow was in the [110] direction, as shown by FIG. 10(b), almost no magnetoresistance effect was observed, with the ratio of change under a constant voltage of 100 V being 0.36%. As described above, this material has a very high anisotropy of some 200000-fold, which is greater than that of any other material known to date. A material exhibiting that degree of anisotropy can be used for magnetic sensor applications and the like in which On/Off switching is just a matter of mechanically rotating the substrate.

EXAMPLE 4

Figure 11A:
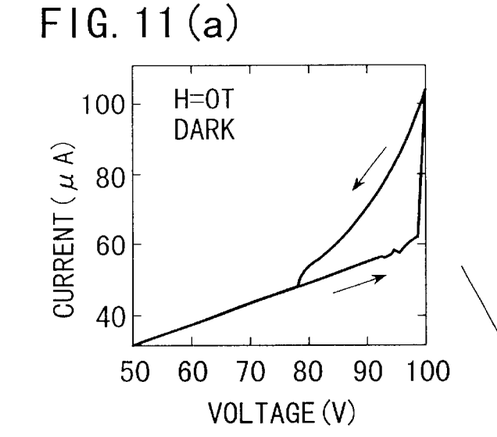
FIG. 11(a) is a graph showing the current/voltage characteristics of a magnetoresistance effect film according to Example 4 of the invention, when a voltage sweep velocity of 5.5 V/sec. is used without any magnetic field being applied.
Figure 11B:
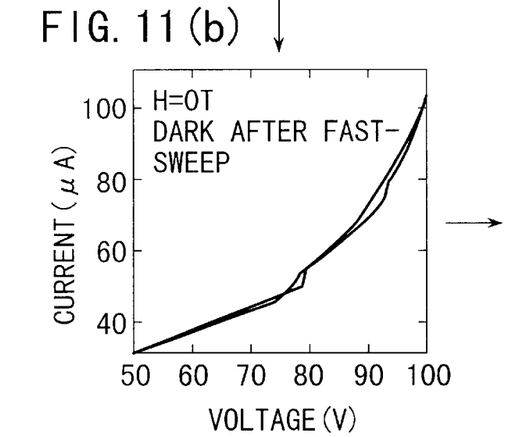
FIG. 11(b) is a graph showing the current/voltage characteristics of the film of FIG. 11(a) obtained using a voltage sweep velocity of 40 V/sec. followed by a voltage sweep velocity of 5.5 V/sec.

As in Example 2, a GaAs substrate was used having a (111) crystal orientation, on which a 0.87-nm thickness of MnSb was vapor-deposited to form ferromagnetic particles, which were covered by a 20-nm-thick layer of GaAs with added Cr. The film thus obtained was provided with In electrodes and the current/voltage values measured. FIG. 11(a) shows the current/voltage characteristics exhibited using a voltage sweep velocity of 5.5 V/sec., without the film being subjected to laser irradiation or the application of a magnetic field. Hysteresis is observable. Using the same conditions, the film was then swept at 40 V/sec. and then at 5.5 V/sec., as a result of which the hysteresis was eliminated, as shown by FIG. 11(b). This change was irreversible.

Figure 11C:
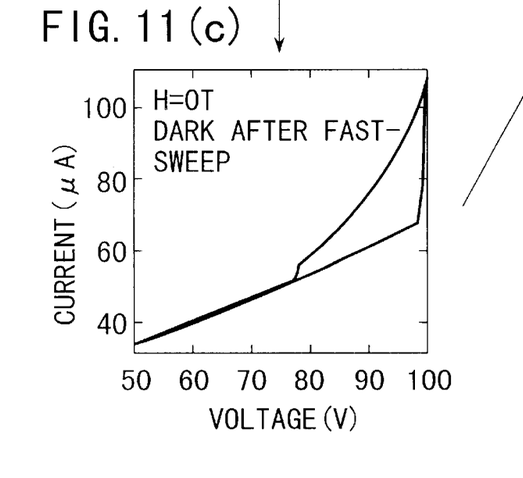
FIG. 11(c) is a graph showing the current/voltage characteristics obtained when the film of FIG. 11(b) is irradiated by a laser beam and then swept at a voltage sweep velocity of 5.5 V/sec.
Figure 11D:
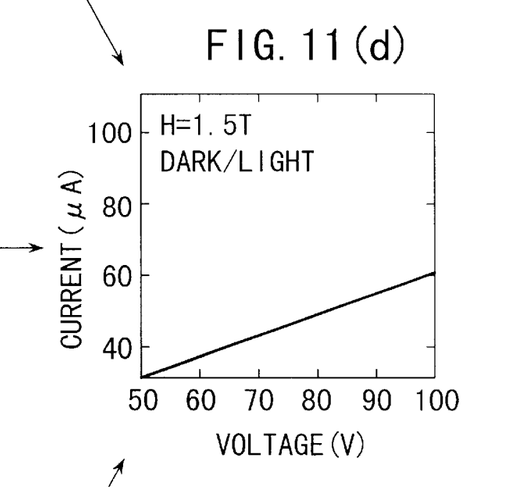
FIG. 11(d) is a graph showing the current/voltage characteristics of the film of FIG. 11(a) when a magnetic field is applied to the film.

FIG. 11(c) shows the results of sweeping at 5.5 V/sec. after irradiating the film with a laser beam at a wavelength of 636 nm but without application of a magnetic field. As can be seen, the current/voltage characteristics again exhibit hysteresis. When a magnetic field was applied to the film in any of the states shown in FIGS. 11(a) to 11(c), the current/voltage characteristics changed as shown in FIG. 11(d). It was found that a stable magnetoresistance effect could be obtained by applying a constant voltage larger than about 78 V. However, in the process of elevating the voltage in the case of the states of FIGS. 11(a) and 11(c), the magnetoresistance effect was very small owing to the hysteresis.

That is, a sweep pulse could be used to switch the magnetoresistance effect on, and laser-beam irradiation could be used to switch the effect off. Thus, in addition to operating the magnetoresistance effect film by magnetic field, voltage (electric field) and light can also be used as control parameters at room temperature. Such characteristics were first realized by the application of semiconductor technology, and can be said to show the way forward to devices with new functions such as magnetoresistance memories on optical integrated circuits.

What is claimed is:

1. A magnetoresistance effect film comprising:

a GaAs substrate;

a plurality of ferromagnetic particles of MnSb disposed on the substrate;

a non-magnetic film of Sb or GaAs deposited on the substrate and covering the plurality of ferromagnetic particles; and a pair of electrodes, each electrode being provided on the non-magnetic film and formed of one material selected from a group consisting of In, Au, Cu, Ag, and Al, in which a resistance across the pair of electrodes is changed by application of a magnetic field.

2. The magnetoresistance effect film according to claim 1, wherein a longest line circumscribed by a particle from the plurality of ferromagnetic particles ranges from 3 nm to 100 nm.

3. The magnetoresistance effect film according to claim 1, wherein a cumulative planar area of the ferromagnetic particles formed on a unit area of the substrate, in a planar direction parallel to a surface of the substrate, does not exceed said unit area of the substrate.

4. The magnetoresistance effect film according to claim 1, in which the GaAs substrate produces an in-plane anisotropy of magnetoresistance effect.

* * * * *